United States Patent [19]
Yoshimori et al.

[11] Patent Number: 5,101,119
[45] Date of Patent: Mar. 31, 1992

[54] CMOS TYPE INPUT BUFFER CIRCUIT FOR SEMICONDUCTOR DEVICE AND SEMICONDUCTOR DEVICE WITH THE SAME

[75] Inventors: Takashi Yoshimori, Kanagawa; Keiji Matsumoto, Yokohama, Japan

[73] Assignee: Kabushiki Kaisha Toshiba, Kawasaki, Japan

[21] Appl. No.: 551,400

[22] Filed: Jul. 12, 1990

[30] Foreign Application Priority Data

Jul. 13, 1989 [JP] Japan .................. 1-181410

[51] Int. Cl.⁵ .................. H03K 3/01; H03K 19/092
[52] U.S. Cl. .................. 307/296.5; 307/475; 307/443; 307/296.3; 365/228
[58] Field of Search .................. 307/475, 443, 296.4, 307/296.3; 365/228, 227, 229

[56] References Cited

U.S. PATENT DOCUMENTS

| | | | |
|---|---|---|---|
| 3,859,638 | 1/1975 | Hume, Jr. .................. | 365/228 |
| 4,388,706 | 6/1983 | Butler .................. | 365/226 |
| 4,587,640 | 5/1986 | Saitoh .................. | 365/229 |
| 4,823,323 | 4/1989 | Higuchi .................. | 365/228 |
| 4,912,346 | 3/1990 | Mizuta .................. | 307/296.4 |
| 4,994,689 | 2/1991 | Kikuda et al. .................. | 307/296.5 |

Primary Examiner—Edward P. Westin
Assistant Examiner—Richard Roseen
Attorney, Agent, or Firm—Foley & Lardner

[57] ABSTRACT

A CMOS type input buffer circuit includes a CMOS inverter comprising a p-channel and n-channel transistors connected in series between a backup or main power source and ground. The input buffer circuit includes a first switching element connected between said CMOS inverter and ground. The input buffer circuit can include a second switching element connected in parallel with said p-channel transistor. A back-up mode signal is applied to both switching elements to turn ON the first switching element and to turn OFF the second switching element during a normal mode and to reverse both switching elements during a backup mode, in which the input buffer circuit is disabled. The input buffer circuit can be connected between a first and second circuit. The first circuit is powered from a backup or main power source. The second circuit is powered from the main power source. A backup detection circuit, connected to the main power source, provides the backup mode signal for the input buffer circuit. In a normal mode first and second circuits are active and a signal is passed through the input buffer circuit. In a backup mode only the first circuit is active and the input buffer circuit is disabled from passing a signal.

10 Claims, 4 Drawing Sheets

CMOS TYPE INPUT BUFFER CIRCUIT FOR SEMICONDUCTOR DEVICE AND SEMICONDUCTOR DEVICE WITH THE SAME

FIELD OF THE INVENTION

This invention relates to a CMOS type input buffer circuit for a semiconductor circuit and a semiconductor device with the same.

BACKGROUND OF THE INVENTION

In recent electronic equipment, there have been an increased number of electronic equipment having a battery backup mode in order that set conditions of the internal or operating results, etc. can be retained even at the time when a main power supply is cut OFF. In the battery backup mode, so called a backup battery is used as its power supply. For this reason, particularly not only for a time period in a battery backup mode, but also in the middle of shift from an ordinary operational mode by the main power supply to the battery backup mode, the current consumption is required to be as small as possible. CMOS type devices hardly consume a current in a static state on the basis of the basic structure and the principle of operation. By drawing attention to this fact, with a view to retaining data at the time of battery backup, it is ordinary practice that CMOS type devices are used.

FIG. 1 shows a basic structure of an electronic equipment having a battery backup mode using a CMOS device as described above.

As seen from this figure, in an ordinary operational mode, the power is delivered from a main power supply 3 to all the system components, i.e., a CMOS device 1 for retaining data and circuitry 5 for other devices or equipment, etc. necessary to be supplied with a power.

On the other hand, in a battery backup mode, i.e., when the main power supply 3 is cut OFF by power supply switches 4, a power is delivered from a backup battery 2 only to the CMOS device 1 for retaining data.

In such a prior art, the problem as described below arises at the time of shift from the ordinary operational mode to the battery backup mode. Namely, in the middle of the mode shift, a through current flows in the input buffer section of the device 1. For this reason, the battery may be consumed. The mechanism of this problem will be described as follows. Namely, generally the input buffer of the CMOS device includes a CMOS inverter comprised of a P-channel MOS transistor Tr1 and an N-channel MOS transistor Tr2 connected in series as shown in FIG. 2. Accordingly, when zero volts or a power supply voltage Vcc is applied to the input terminal IN, one of the P-channel transistor Tr1 and the N-channel transistor Tr2 is turned ON and the other thereof is turned OFF. Because either transistor is cut OFF as stated above, no d.c. current is consumed. However, when an intermediate potential between zero volts and Vcc is applied to the input terminal IN, the transistors Tr1 and Tr2 are both turned ON. As a result, the so called through current flows. Accordingly, in the process of the mode shift from the ordinary operational mode to the battery backup mode, where the interface section from the circuit 5 to the device 1 is placed at an intermediate potential for any reason, a through current flows, giving the cause of consumption of the battery as previously described. By inserting a pull-up resistor in the input buffer circuit of FIG. 2, an improvement is made to some extent. However, ordinarily the pull-up resistor of the equipments which use CMOS device is more than several KΩ because of output buffer current characteristics. For this reason, where the intermediate potential of the circuit 5 in FIG. 1 is kept for a relatively long time at an impedance lower than the pull-up resistance, the effect of the pull-up resistor is not sufficient.

SUMMARY OF THE INVENTION

This invention has been made in view of the above, and its object is to provide a CMOS type input buffer circuit for a semiconductor device and a semiconductor device with the same, the circuit being constructed so that no through-current flows even in the process of the mode shift from the ordinary operational mode to the battery back up mode.

In the input buffer circuit of this invention, at the time of an ordinary operation, the first switching element is turned ON. For this reason, the circuit operates as an ordinary input buffer circuit. At the time of a battery backup mode, the first switching element is turned OFF. Thus, a path through which a through-current flows is cut off and a potential fixed to a power supply potential is provided as an output. Thus, current consumption is held down to a minimum value. Furthermore, in this invention, preferably a power supply potential is provided as an output, resulting in no possibility that an intermediate potential is provided. Thus, an intermediate potential is prevented from being transmitted to the circuit of the succeeding stage, and occurrence of a through-current at the circuit of the succeeding stage is suppressed.

DESCRIPTION OF THE PREFERRED EMBODIMENTS

Figure 2:
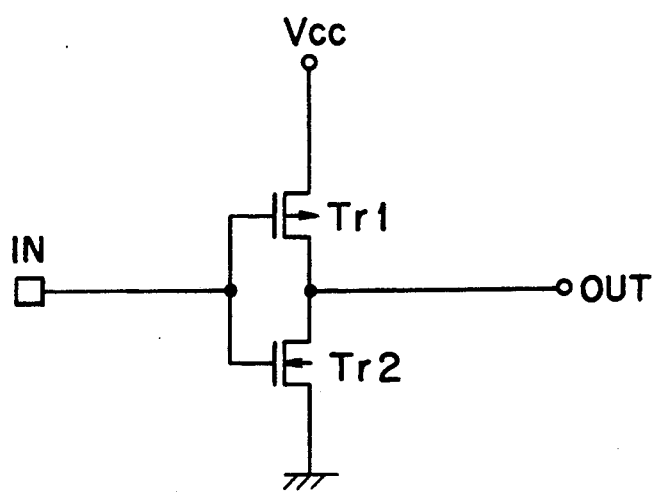
FIG. 2 is a circuit diagram of an input buffer circuit of the equipment shown in FIG. 1.
Figure 3:
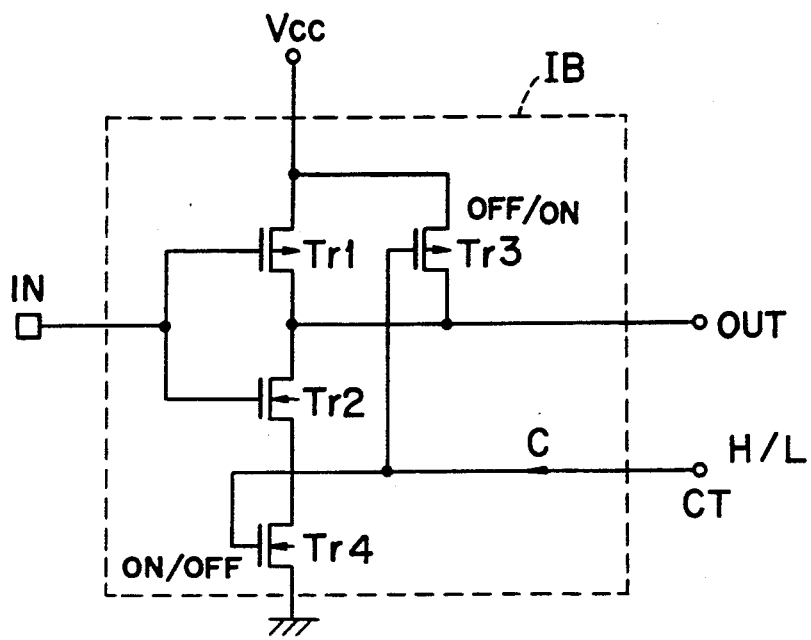
FIG. 3 is a circuit diagram of a first embodiment of this invention.

FIG. 3 is a circuit diagram showing an input buffer circuit IB of an embodiment according to this invention. In FIG. 3, the same reference numerals as those of FIG. 2 are attached to components identical to those of FIG. 2, respectively. The circuit of FIG. 3 differs from the circuit of FIG. 2 as follows. Namely, a P-channel transistor Tr3 for control is connected in parallel with the transistor Tr1. An N-channel transistor Tr4 for control is connected in series with the transistor Tr2. A control signal C from the control terminal CT can be applied to each of gates of the transistors Tr3 and Tr4. This control signal C is a signal of which level varies in dependency of the above-described mode shift from the ordinary operational mode to the battery backup mode. At the time of the ordinary operational mode, the control signal C is at H level, and at the time of the battery backup mode, the control signal C is at L level. By changes in the level of such a control signal C, the operational mode of the circuit itself of FIG. 3 is also switched between the ordinary operational mode and the battery backup mode.

The operation of the circuit of FIG. 3 will now be described below.

When the circuit is in the ordinary operational mode, a control signal C of H level is applied to the control terminal CT. As a result, the transistor Tr3 for control is in an OFF state and the transistor Tr4 for control in an ON state. Thus, the circuit of FIG. 1 functions as an ordinary input buffer.

When the operational mode of the entirety of the device shifts to the battery backup mode, the control signal changes from H level to L level at the timing of that shift. As a result, the transistor Tr3 changes from OFF state to ON state, and the transistor Tr4 changes from ON state to OFF state. Because the transistor Tr4 is cut OFF, in the process of the mode shift of the entirety of the device, even if any voltage is applied to the input terminal IN, there is no possibility that any through-current flows from the power supply Vcc to the ground. Furthermore, as a result of the fact that the transistor Tr3 is in an ON state, the output terminal OUT is fixed at H level. For this reason, there is also no possibility that an intermediate potential between H and L level is propagated through the internal circuit connected to the next stage of the input buffer circuit of FIG. 1 and stages succeeding thereto. Thus, a through-current based on an intermediate potential taking place can be prevented.

Figure 1:
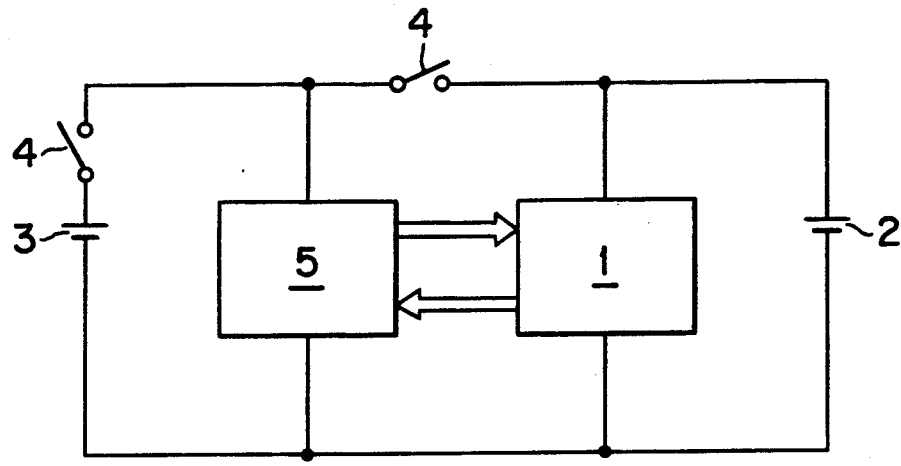
FIG. 1 is a circuit diagram of an electronic equipment of the background art.
Figure 4:
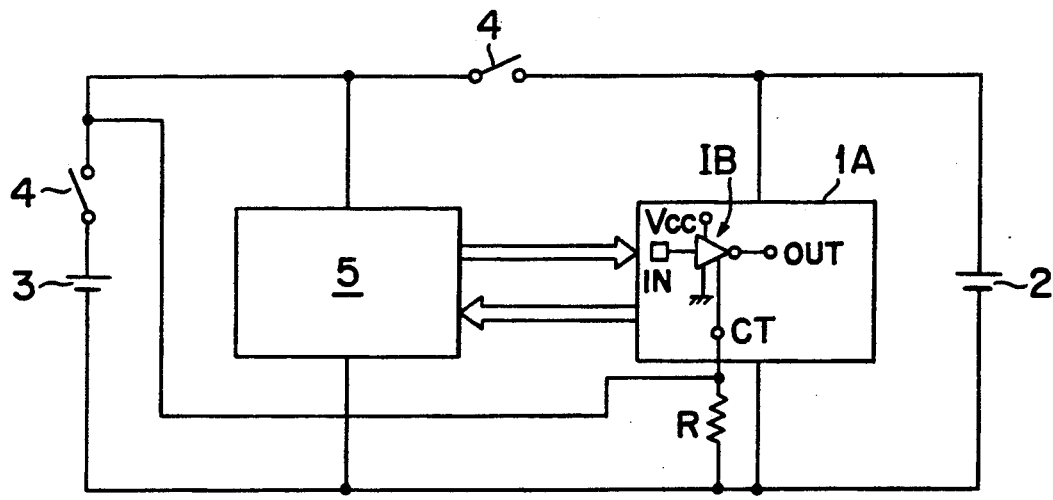
FIG. 4 is a circuit diagram of an electronic equipment to which the circuit shown in FIG. 3 is applied.

FIG. 4 is a circuit diagram corresponding to FIG. 1 which has been previously described, and shows a general form of an electronic equipment to which the input buffer circuit of FIG. 3 is applied. In FIG. 4, the same reference numerals as those of FIG. 1 are attached to circuit components identical to those of FIG. 1, respectively. The circuit of FIG. 4 differs from the circuit of FIG. 1 as follows. A CMOS device 1A for retaining data includes an input buffer circuit IB of FIG. 3 as the input buffer. In order to provide a control signal C applied to the input buffer circuit IB, the positive terminal side of the main power supply 3 is connected to the negative terminal side thereof through a resistor R. One end of the resistor R is connected to the control terminal CT of the input buffer circuit.

In the device of FIG. 4, when each power supply switch 4 is in an ON state, the device is in the ordinary operational mode. Following OFF state of each switch 4, the operational mode of the device shifts to the battery backup mode. Furthermore, following OFF state of the switch, a potential drop across the resistor R is lost. As a result, the control signal C changes from H level to L level. By this level change, as described in FIG. 3, the operational mode of the input buffer circuit IB also shifts to the battery backup mode. At this time, a through-current is prevented from flowing.

Figure 5:
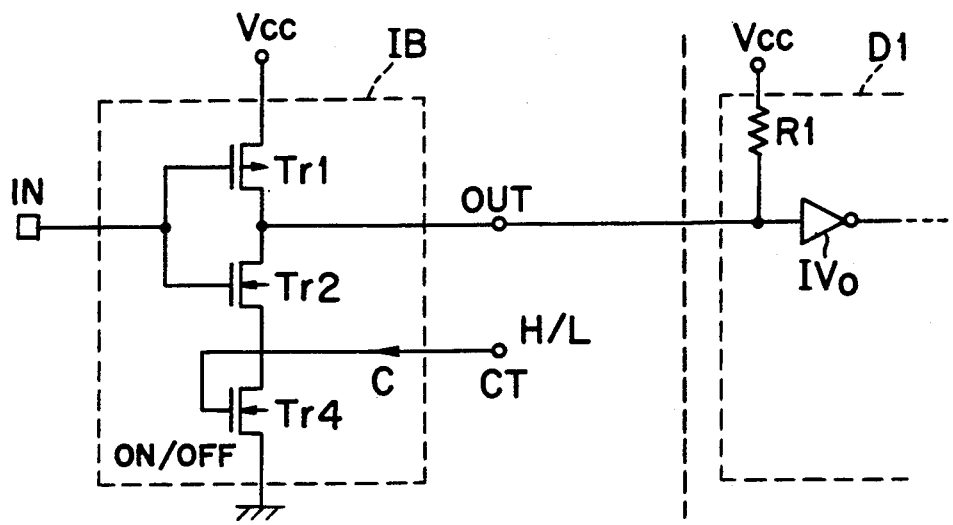
FIGS. 5 to 7 are circuit diagrams of embodiments of input buffer circuits different from each other, respectively.
Figure 6:
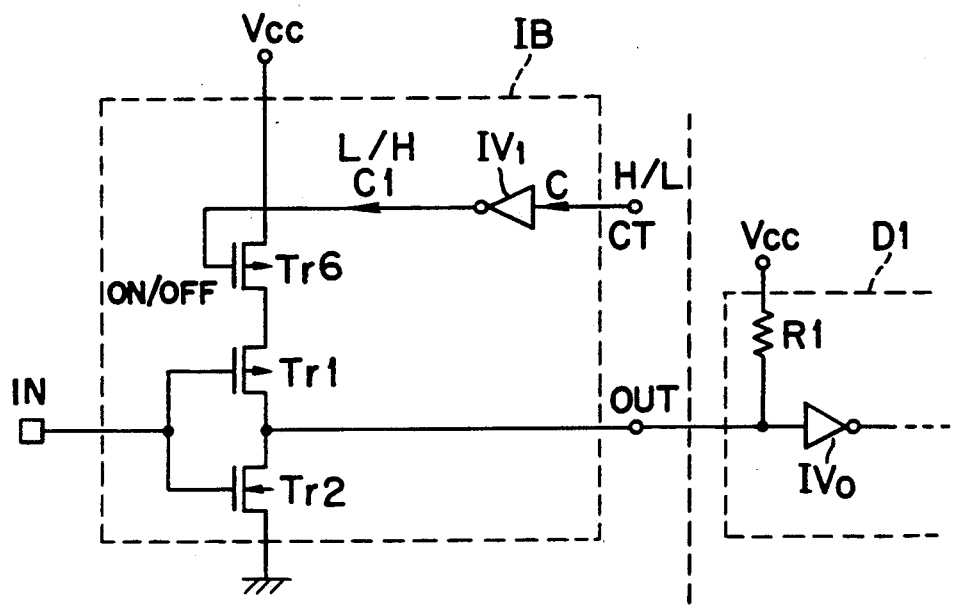
Figure 7:
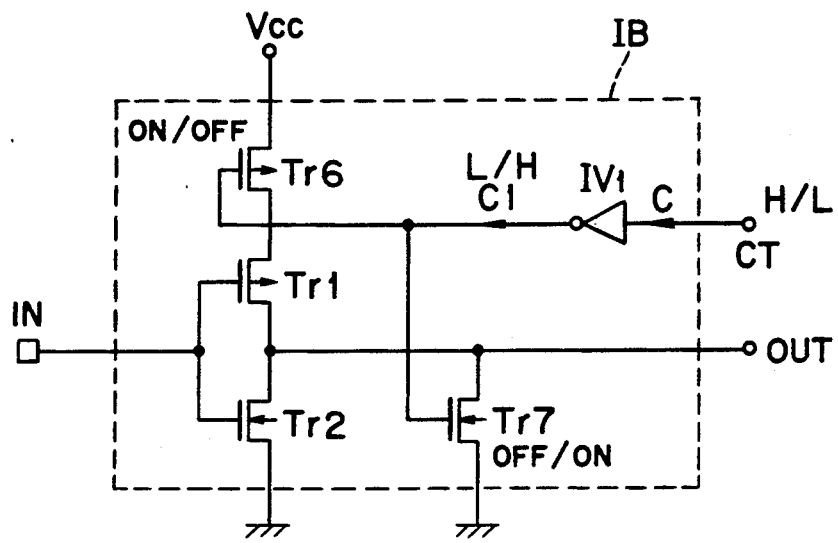

FIGS. 5 to 7 show embodiments of input buffer circuits different from each other of this invention, respectively. FIG. 5 shows the embodiment wherein the transistor Tr3 of FIG. 3 is omitted. Omission of this transistor Tr3 is made on the basis of the following point of view. Namely, if a circuit connected to the next stage of the input buffer circuit IB is pulled up or pulled down, the transistor Tr3 in parallel with the transistor Tr1 in FIG. 3 is unnecessary. FIG. 5 shows an input buffer in the case where a circuit D1 of the next stage is pulled up. Namely, in FIG. 5, the output terminal OUT is connected to the input terminal of the circuit D1 of the next stage. At the input terminal of the circuit D1, the input side of the inverter $IV_0$ is connected to the power supply Vcc by the pull-up resistor R1, and is thus pulled up.

FIG. 6 shows the embodiment wherein a transistor Tr6 on the power supply Vcc side is used in place of the transistor Tr4 on the earth side. It is to be noted that since the transistor Tr6 is of P-channel type, an approach is employed to invert control signal C inputted to the control terminal CT by an inverter $IV_1$ to prepare a control signal C1 to apply this signal C1 to the gate of the transistor Tr6.

In the input buffer of FIG. 3, the transistor Tr3 is connected in parallel with the transistor Tr1 and the transistor Tr4 is provided on the earth side of the transistor Tr2. On the contrary, in the input buffer of FIG. 7, a transistor Tr6 is provided on the power supply Vcc side of the transistor Tr1 and a transistor Tr7 is provided in parallel with the transistor Tr2. It is to be noted that since the types opposite to those in the case of FIG. 3, i.e., a P-channel transistor and an N-channel transistor are used as the transistors Tr6 and Tr7, respectively, an approach is employed in the same manner as in the case of FIG. 6 to invert a control signal C by an inverter $IV_1$ to thereby prepare a control signal C1 to apply the control signal C1 to the gates of the transistors Tr6 and Tr7. At the time of the battery backup mode, a signal of L level is outputted from the output terminal of FIG. 7.

It is to be noted while the timing of the mode shift to the battery backup mode is detected by the resistor R of FIG. 4 in the above-described embodiments, detection of that timing is not limited to such means, but may be conducted by any other means.

Figure 8:
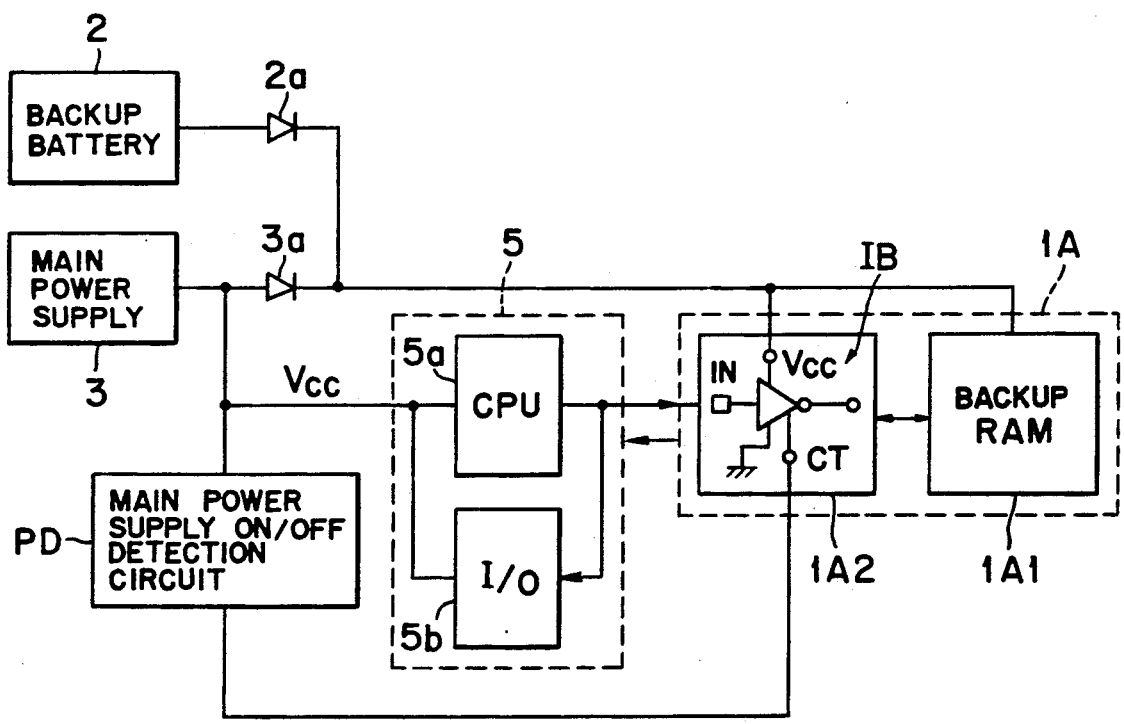
FIG. 8 is a circuit diagram showing a different embodiment of this invention.

FIG. 8 is a circuit diagram showing a different embodiment of this invention. In FIG. 8, the same reference numerals as those in FIG. 4 are attached to elements identical to those in FIG. 4, respectively.

A power is delivered only from the main power supply 3 to the circuit 5. This circuit 5 comprises, e.g., a CPU 5a and an I/O 5b. Both the main power supply 3 and the backup battery 2 are connected to the device 1A. At the time of an ordinary operational mode, the power is delivered only from the main power supply 3, and at the time when the main power supply 3 is cut OFF, a power is delivered only from the backup battery 2. The device 1A comprises, e.g., a backup RAM 1A1 and a backup RAM controller 1A2. An input buffer circuit IB in this controller 1A2 has the same structure as those of, e.g., circuits of FIGS. 3, 5, 6 and 7. A detection signal from the main power supply on/off detection circuit PD is applied to the terminal CT of this circuit IB. This circuit PD outputs a signal of H level when the main power supply 3 is in ON state, and outputs a signal of L level when it is in OFF state. Powers from the main power supply 3 and the backup battery 2 are delivered to the system through diodes 3a and 2a for preventing counter flow of a current, respectively. It is to be noted that only elements essential for the description of this invention are illustrated in FIG. 8, and other elements or signal lines are omitted.

In the system of FIG. 8, at the time of an ordinary operational mode, a power is delivered to both the circuit 5 and the device 1A. On the other hand, at the time of battery backup mode, the power is delivered from the battery 2 only to the device 1A.

More particularly, at the time of an ordinary operational mode, the detection circuit PD applies a signal of H level to the terminal CT of the input buffer circuit IB. For this reason, this circuit IB carries out so called an ordinary buffer operation. Accordingly, e.g., an address signal or a control signal delivered from the CPU 5a, and/or a data signal from I/O 5b of the circuit 5 are applied to the input terminal IN of the input buffer circuit IB. These signals are subjected to a predetermined processing in the controller 1A2, and are then outputted from the output terminal OUT. The signals thus outputted are applied to the RAM 1A1 of the next stage. On the contrary, data which has been read from the RAM 1A1 is applied to the circuit 5 through the controller 1A2.

Furthermore, at the time of a battery backup mode, i.e., when the main power supply 3 is in OFF state, supply of the power to the circuit 5 is stopped. For this reason, levels of the above-mentioned various signals (address signal, control signal, and data signal) applied from the circuit 5 to the device 1A transiently become unstable. On the other hand, the power is delivered from the backup battery 2 to the device 1A. However, since the main power supply 3 is in OFF state, the detection circuit PD applies a signal of L level to the terminal CT of the input buffer circuit IB. Thus, the circuit IB is electrically separated from between the power supply Vcc and ground as seen from FIGS. 3, 5, 6 and 7. For this reason, irrespective of the level of a signal applied from the circuit 5, a through-current is prevented from flowing in the input buffer circuit IB. The power is delivered from the backup battery 2 to the backup RAM 1A1. Thus, there is no possibility that data previously inputted into the RAM 1A1 is lost.

What is claimed is:

1. A CMOS type input buffer circuit for a semiconductor device, comprising:
   a CMOS inverter comprising a first transistor of a P-channel and a second transistor of a N-channel connected in series between a power supply terminal and ground; and
   a first switching element connected to said CMOS inverter, wherein said when said semiconductor device is in an ordinary operational mode where it operates by a main power supply, said first switching element is turned ON, and when said semiconductor device is in a backup mode where it operates by a backup battery, said first switching element is turned OFF, and wherein said first switching element is connected between said CMOS inverter and ground, a backup mode signal outputted at the time of said backup mode being applied to a control terminal of said first switching element.

2. A circuit as set forth in claim 1, wherein a second switching element is connected in parallel with said first transistor, the backup mode signal outputted at the time of said backup mode being applied to a control terminal of said second switching element.

3. A circuit as set forth in claim 2, wherein said first switching element is comprised of an N-channel transistor, said second switching element being comprised of a P-channel transistor, respective control terminals of said first and second switching elements being commonly connected.

4. A CMOS type input buffer circuit for a semiconductor device, comprising:
   a CMOS inverter comprising a first transistor of a P-channel and a second transistor of a N-channel connected in series between a power supply terminal and ground; and
   a first switching element connected to said CMOS inverter, wherein when said semiconductor device is in an ordinary operational mode where it operates by a main power supply, said first switching element is turned ON, and when said semiconductor device is in a backup mode where it operates by a backup battery, said first switching element is turned OFF, wherein said first switching element is connected between said CMOS inverter and said power supply terminal, a backup mode signal outputted at the time of said backup mode being applied to a control terminal of said first switching element; and
   wherein a second switching element is connected in parallel with said second transistor, the backup mode signal outputted at the time of said backup mode being applied to a control terminal of said second switching element.

5. A circuit as set forth in claim 4, wherein said first switching element is comprised of a P-channel transistor, said second switching element being comprised of an N-channel transistor, respective control terminals of said first and second switching elements being commonly connected.

6. A semiconductor device, comprising:
   a main power supply for delivering a power at the time of an ordinary operational mode;
   a backup battery for delivering a power at the time of a battery backup mode;
   a main power supply ON/OFF signal detection circuit for outputting an ON/OFF signal corresponding to ON/OFF of said main power supply;
   a first circuit operative by a power delivered from said main power supply at the time of said ordinary operational mode to output a signal; and
   a second circuit wherein when said semiconductor device is in said ordinary operational mode, said second circuit is supplied with a power from said main power supply, and when an output from said first circuit is applied thereto, said second circuit is operated in dependency upon said output, and wherein when said semiconductor device is in said backup mode, said second circuit is operated by a power delivered from said backup battery at the time of said backup mode,
   said second circuit including a CMOS type input buffer circuit to which an output from said first circuit is applied,
   said CMOS type input buffer circuit comprising:
   a CMOS inverter including a first transistor of a P-channel and a second transistor of a N-channel connected in series between a power supply terminal and ground; and
   a first switching element connected to said CMOS inverter, whereby when said semiconductor device is in the ordinary operational mode where it operates by said main power supply, said switching element is turned ON, and when said semiconductor device is in the backup mode where it operates by said backup battery, said switching element is turned OFF, and
   wherein said first switching element is connected between said CMOS inverter and ground, a backup mode signal outputted at the time of said backup mode being applied to a control terminal of said first switching element.

7. A semiconductor device as set forth in claim 6, wherein a second switching element is connected in parallel with said first transistor, the backup mode signal outputted at the time of said backup mode being applied to a control terminal of said second switching element.

8. A semiconductor device as set forth in claim 7, wherein said first switching element is comprised of an N-channel transistor, said second switching element being comprised of a P-channel transistor, respective control terminals of said first and second switching elements being commonly connected.

9. A semiconductor device, comprising:
a main power supply for delivering a power at the time of an ordinary operational mode;
a backup battery for delivering a power at the time of a battery backup mode;
a main power supply ON/OFF signal detection circuit for outputting an ON/OFF signal corresponding to ON/OFF of said main power supply;
a first circuit operative by a power delivered from said main power supply at the time of said ordinary operational mode to output a signal; and
a second circuit wherein when said semiconductor device is in said ordinary operational mode, said second circuit is supplied with a power from said main power supply, and when an output from said first circuit is applied thereto, said second circuit is operated in dependency upon said output, and wherein when said semiconductor device is in said backup mode, said second circuit is operated by a power delivered from said backup battery at the time of said backup mode,
said second circuit including a CMOS type input buffer circuit to which an output from said first circuit is applied,
said CMOS type input buffer circuit comprising:
a CMOS inverter including a first transistor of a P-channel and a second transistor of a N-channel connected in series between a power supply terminal and ground; and
a first switching element connected to said CMOS inverter, whereby when said semiconductor device is in the ordinary operational mode where it operates by said main power supply, said switching element is turned ON, and when said semiconductor device is in the backup mode where it operates by said backup battery, said switching element is turned OFF, wherein said first switching element is connected between said CMOS inverter and said power supply terminal, a backup mode signal outputted at the time of said backup mode being applied to a control terminal of said first switching element and wherein a second switching element is connected in parallel with said second transistor, the backup mode signal outputted at the time of said backup mode being applied to a control terminal of said second switching element.

10. A semiconductor device as set forth in claim 9, wherein said first switching element is comprised of a P-channel transistor, and said second switching element being comprised of an N-channel transistor, respective control terminals of said first and second switching elements being commonly connected.

* * * * *